United States Patent

Hung et al.

[11] Patent Number: 6,101,868
[45] Date of Patent: Aug. 15, 2000

[54] TOOL FOR INSPECTING BROKEN WAFER EDGES

[75] Inventors: Jackey Hung; Ching-I Kuo, both of Taichung; Rubo Dong, Chang-Hua; Shu-Wei Tu, Taipei, all of Taiwan

[73] Assignee: United Semiconductor Corp., Hsinchu, Taiwan

[21] Appl. No.: 09/107,164

[22] Filed: Jun. 9, 1998

[30] Foreign Application Priority Data

Apr. 21, 1998 [TW] Taiwan .................................. 87206062

[51] Int. Cl.⁷ .................................................... G01B 11/30
[52] U.S. Cl. ........................................ 73/104; 204/298.03
[58] Field of Search ........................... 73/865.8, 865.9, 73/104; 204/298.03, 192.13

[56] References Cited

U.S. PATENT DOCUMENTS

| | | | |
|---|---|---|---|
| 4,409,087 | 10/1983 | Quick ................................. | 204/298.03 |
| 4,676,883 | 6/1987 | Nelson et al. ...................... | 204/192.13 |
| 4,803,871 | 2/1989 | Harada et al. ..................... | 73/104 |
| 4,957,605 | 9/1990 | Hurwitt et al. .................... | 204/192.12 |
| 5,674,366 | 10/1997 | Hayashi et al. ................... | 204/298.03 X |
| 5,690,744 | 11/1997 | Landau .............................. | 204/192.13 |
| 5,970,807 | 10/1999 | Hsu et al. .......................... | 73/865.8 X |

FOREIGN PATENT DOCUMENTS

| | | | |
|---|---|---|---|
| 143241 | 8/1983 | Japan ..................................... | 73/104 |
| 235470 | 9/1988 | Japan ............................... | 204/298.03 |
| 228472 | 9/1990 | Japan ............................... | 204/298.03 |
| 311248 | 12/1990 | Japan ..................................... | 73/104 |
| 108736 | 5/1991 | Japan ................................... | 73/865.8 |
| 173768 | 7/1991 | Japan ............................... | 204/298.03 |

Primary Examiner—Thomas P. Noland
Attorney, Agent, or Firm—Christie, Parker & Hale, LLP

[57] ABSTRACT

A wafer inspection tool for determining the cause of broken wafer edges. The wafer inspection tool comprises a circular transparent plate having a profile similar to a wafer. The circular transparent plate further includes a wafer edge notch for aligning with a wafer and a plurality of clamp pin notches showing wafer clamp pin positions of a particular sputtering chamber. The wafer inspection tool is placed on a sputtering chamber in an easily accessible, one for each sputtering chamber. When broken edges are found on a wafer, the cause of the broken wafer can be traced back by overlaying the broken wafer on the transparent plate with their respective wafer edge notches aligned together. Then, the positions of broken edges are compared with the clamp pin notches on the tool. If broken edges of the wafer match the clamp pin notch positions of a particular chamber, the particular chamber that causes the broken edges is found.

11 Claims, 1 Drawing Sheet

TOOL FOR INSPECTING BROKEN WAFER EDGES

CROSS-REFERENCE TO RELATED APPLICATION

This application claims the priority benefit of Taiwan application serial no. 87206062, filed Apr. 21, 1998, the full disclosure of which is incorporated herein by reference.

BACKGROUND OF THE INVENTION

1. Field of Invention

The present invention relates to a tool for inspecting broken wafer edges. More particularly, the present invention relates to a wafer inspection tool capable of assisting in finding the cause of broken wafer edges.

2. Description of Related Art

In the manufacturing of conventional semiconductor devices, sputtering methods can be used to deposit thin films because of their good step coverage capability. In fact, sputtering methods are quite often used to deposit metallic layers and barrier layers. Normally, a sputtering machine has a number of different chambers to carry out different sputtering programs for achieving different goals.

In general, each wafer in a sputtering chamber is fixed in position by a number of clamp pins. However, the pressure caused by these clamp pins can sometimes break off tiny pieces from the edges of a wafer. These broken wafer edges have a tendency to retain a residual amount of the chemical reagents used in subsequent processes. Consequently, quality of the finished product may be affected.

As a normal sputtering machine (for example, an Endura machine) may contain a few chambers, broken wafer edges can be discovered only when the last stages of the processing operation have been completed. Whenever broken edges are discovered on the wafer, it is very difficult to determine where they happened. For example, the broken edges may or may not be caused by the sputtering machine. Furthermore, even if we are certain that those broken edges are caused by the sputtering machine, it is still very difficult to trace the cause to a specific set of clamp pins in a particular chamber.

The conventional method of tracing the cause in the sputtering machine is to lower the temperature and release the vacuum in one chamber. Then, the chamber is opened up to see if the clamp pins in that chamber caused the broken edges. If broken edges are not caused by that particular chamber, vacuum in the chamber has to be reestablished and the chamber has to be heated up again so that the previous operating state of the chamber is regained. However, raising temperature inside a chamber takes a long time. Therefore, whenever a particular chamber is down to check for the cause of broken edges, subsequent processing operations will be affected and productivity will be lowered.

In summary, the conventional method of lowering and raising the temperature in each chamber in turn to check for the cause of broken edges on a wafer is both time-consuming and rather indefinite. Moreover, subsequent processing flow may be affected.

In light of the foregoing, there is a need to provide some tools for determining the cause of broken edges on a wafer.

SUMMARY OF THE INVENTION

Accordingly, the present invention is to provide simple inspection tools for tracing the cause of broken edges on a wafer to a particular sputtering chamber without having to check each chamber in a guesswork manner.

To achieve these and other advantages and in accordance with the purpose of the invention, as embodied and broadly described herein, the invention provides a wafer inspection tool for tracing the cause of broken edges on a wafer to a particular sputtering chamber. The tool comprises a circular, transparent plate having a profile similar to a wafer. The tool is placed on a sputtering chamber in an easily accessible position. There is a wafer edge notch on the circular transparent plate for aligning with a wafer. In addition, there are multiple of wafer clamp pin notches on the periphery of the circular transparent plate for showing the positions of clamp pins that holds a wafer in a particular chamber. When broken edges are found on a wafer, the wafer can be overlaid on the tool alongside the chamber. If the broken edges of a wafer match the clamp pin notches on the tool, the particular chamber that causes broken wafers is discovered. If not, the search can be repeated by comparing with similar tools on other chambers until the correct one is found. If none of the tools match, there may be outside source leading to broken wafers, which are unrelated to the sputtering machine.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serves to explain the principles of the invention. In the drawing.

DESCRIPTION OF THE PREFERRED EMBODIMENTS

Figure 1:
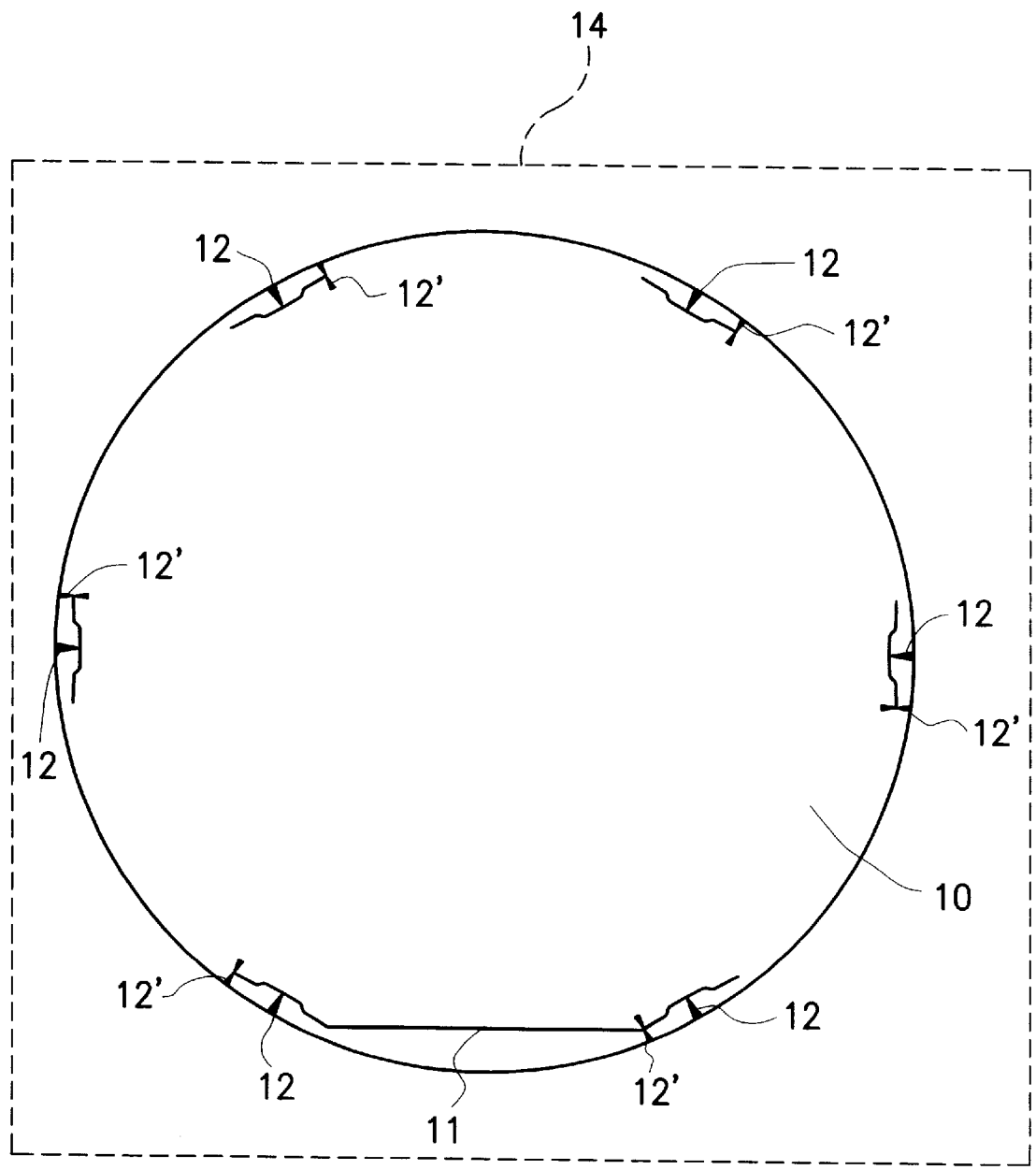
FIG. 1 is a top view showing the tool used for determining the cause of broken edges on a wafer.

Reference will now be made in detail to the present preferred embodiments of the invention, examples of which are illustrated in the accompanying drawings. Wherever possible, the same reference numbers are used in the drawings and the description to refer to the same or like parts.

A sputtering machine, for example, an Endura machine, can have a number of chambers. The dashed line, 14, in FIG. 1 schematically depicts a chamber within the sputtering machine. When broken edges are discovered on a wafer, the wafer inspection tool of this invention is able to determine the particular chamber that causes the damage in a quick and simple manner.

The wafer inspection tool used for detecting the cause of broken wafer edges comprises a circular transparent plate 10 whose profile resembles a wafer. The circular transparent plate 10 can be made from an acrylic material, and has a size similar to an 8-inch wafer or a 12-inch wafer, for example. One circular transparent plate 10 is placed inside each chamber in a position that allows easy observation from outside. There is a wafer edge notch 11 on the circular transparent plate 10. The wafer edge notch 11 is used to align the plate and the wafer. In addition, multiple clamp pin notches such as 12 or 12' are placed around the periphery of the circular transparent plate 10. The clamp pin notches are used to indicate the position of the clamp pins on a wafer in a particular chamber.

In FIG. 1, clamp pin notches 12 should appear on the periphery of a circular transparent plate 10 for positioning inside a first chamber. Similarly, clamp pin notches 12' should appear on the periphery of a second circular transparent plate 10' for positioning inside a second chamber. However, for illustration purposes, both clamp pin notches 12 and 12' are marked on the same circular transparent plate 10.

As soon as broken edges are found on a wafer, the wafer can be overlaid on the wafer inspection tool by aligning the wafer edge notch on the wafer with the wafer edge notch 11 on the tool. Thereafter, clamp pin notches on the wafer inspection tool can be compared with the broken edge positions on the wafer. Since each chamber has one wafer inspection tool having that chamber's particular wafer clamp pin notches in it, (for example, notches 12 or notches 12' in FIG. 1), one can easily trace the cause of the broken wafer to a particular chamber. When the problematic chamber is found, the particular chamber can be cooled down and the vacuum inside the chamber released for further detailed inspection. Hence, the other chambers can continue their operations, and consequently there is little effect on productivity.

On the other hand, if none of the clamp pin notches on each of the wafer inspection tools matches the broken wafer, the broken wafer is not caused by the sputtering machine. Hence, external causes should be sought.

By hanging a wafer inspection tool that has a number of clamp pin notches marked on its periphery on each chamber, broken wafers can be compared with the tool on each chamber and the problematic chamber can be traced immediately. There is no need for inspecting each chamber individually, and hence inspection time can be greatly reduced and productivity can be maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer inspection tool installed on a sputtering machine for determining the cause of broken wafer edges, the tool comprising:

a circular transparent plate having a profile similar to a wafer placed on a sputtering chamber at an easily accessible location;

a wafer edge notch on the edge of the circular transparent plate used for aligning with a wafer that has broken edges; and a plurality of wafer clamp pin notches on the periphery of the circular transparent plate used for showing wafer clamp pin positions inside a particular sputtering chamber.

2. The tool of claim 1, wherein the circular transparent plate is made from an acrylic material.

3. The tool of claim 1, wherein the circular transparent plate has a size similar to an 8-inch wafer.

4. The tool of claim 1, wherein the circular transparent plate has a size similar to a 12-inch wafer.

5. The tool of claim 1, wherein the sputtering machine includes a sputtering machine.

6. A wafer inspection tool installed on a sputtering machine for determining the cause of broken edges on a wafer, the tool comprising:

a circular transparent plate having a profile similar to a wafer and placed on a sputtering chamber at an easily accessible location; and notches on the periphery of the circular transparent plate for showing wafer clamp pin positions inside a particular sputtering chamber.

7. The tool of claim 6, wherein the notches further include a wafer edge notch for aligning with a wafer and a plurality of wafer clamp pin notches for showing wafer clamp pin positions inside a particular sputtering chamber.

8. The tool of claim 6, wherein the circular transparent plate is made from an acrylic material.

9. The tool of claim 6, wherein the circular transparent plate has a size similar to an 8-inch wafer.

10. The tool of claim 6, wherein the circular transparent plate has a size similar to a 12-inch wafer.

11. The tool of claim 6, wherein the sputtering machine includes a sputtering machine.

\* \* \* \* \*